US011054753B1

(12) United States Patent
Kaplan et al.

(10) Patent No.: US 11,054,753 B1
(45) Date of Patent: Jul. 6, 2021

(54) OVERLAY MONITORING

(71) Applicant: APPLIED MATERIALS ISRAEL LTD., Rehovot (IL)

(72) Inventors: Vladislav Kaplan, Raanana (IL); Shay Attal, Rehovot (IL); Lavi Jacov Shachar, Tel Aviv (IL); Kevin Ryan Houchens, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/853,586

(22) Filed: Apr. 20, 2020

(51) Int. Cl.
*G01B 11/00* (2006.01)
*G03F 7/20* (2006.01)
*H01L 21/66* (2006.01)

(52) U.S. Cl.
CPC .......... *G03F 7/70633* (2013.01); *H01L 22/12* (2013.01)

(58) Field of Classification Search
CPC . G03F 7/70633; G03F 7/70616; H01L 22/12; H01L 2237/221; H01L 2237/24475; H01L 2237/2448
See application file for complete search history.

(56) References Cited

U.S. PATENT DOCUMENTS

2020/0365365 A1* 11/2020 Yamamoto .......... G03F 7/70616

* cited by examiner

*Primary Examiner* — Peter B Kim
(74) *Attorney, Agent, or Firm* — Kilpatrick Townsend & Stockton LLP

(57) ABSTRACT

A method for overlay monitoring including: obtaining a secondary electron image and a backscattered electron image of as area of the substrate in which an array of first structural elements are positioned at a surface of the substrate and a second array of second structural elements are positioned below the first array; determining locations of the first structural elements within the secondary electron image; defining regions of interest in the backscattered electron image, based on the locations of the first structural elements; processing pixels of the backscattered electron image that are located within the regions of interest to provide a backscattered electron representation of a second structural element; and calculating an overlay error based on location information regarding the second structural element within the backscattered electron representation of the second structural element and on location information regarding of at least one first structural element in the secondary electron image.

15 Claims, 5 Drawing Sheets

OVERLAY MONITORING

BACKGROUND OF THE INVENTION

A semiconductor wafer (sometimes referred to herein as just a "wafer") includes multiple layers that are manufactured by a highly complex manufacturing process.

In many cases, a structural element of one layer of the wafer should be aligned with a structural element of another layer of the wafer. For example, a conducting line of one layer should be aligned with a hole formed at another layer. The hole may be filled with conductive material that may form a conductive path with the conducting line.

Misalignments (also known as overlay errors) between different elements of different layers of the wafer may result in failures. For example, the conducting line may be misaligned with the hole, which may result in a gap in the conductive path.

Overlay errors may be detected using optical overlay tools which have a limited resolution.

Scanning electron microscopes can be used to detect overlay errors. Nevertheless, it has been found that detecting buried structural elements may require a vast number of exposures to a charged electron beam, which may damage the wafer.

There is a growing need to provide a safe method for overlay monitoring.

BRIEF SUMMARY OF THE INVENTION

Embodiments of the disclosure provide a method, a non-transitory computer readable medium and a system for overlay monitoring.

In some embodiments a method for overlay monitoring is provided. The method can include: obtaining a secondary electron image of an area of a substrate and a backscattered electron image of the area of the substrate, the area of the substrate comprising a first array of first structural elements that are repeatable and are positioned at a surface of the substrate and a second array of second structural elements that are repeatable and are positioned below the first array and below the surface of the substrate; determining locations of the first structural elements within the secondary electron image; defining regions of interest in the backscattered electron image, based on the locations of the first structural elements; processing pixels of the backscattered electron image that are located within the regions of interest to provide a backscattered electron representation of a second structural element; and calculating an overlay error based on location information regarding the second structural element within the backscattered electron representation of the second structural element and on location information regarding of at least one first structural element in the secondary electron image.

Various implementations of the method can include one or more of the following. The processing of pixels can include averaging pixels located at same locations within different regions of interest to provide a synthetic backscattered electron image of the second structural element. The determining of the locations of the first structural elements can include applying a blob analysis. The calculation of the overlay error can include calculating a displacement between a center of the at least one first structural element and a center of the second structural element within the backscattered electron representation. A signal to noise ratio of the backscattered electron image can be below an allowable signal to noise ratio threshold where a signal to noise ratio of the backscattered electron representation is not smaller than the allowable signal to noise ratio threshold. The secondary electron image of the area and the backscattered electron image of the area can be acquired concurrently. The secondary electron image and the backscattered electron image can be generated without damaging the area. The secondary electron image of the area can be generated by processing a number of secondary electron frames of the area and the backscattered electron image of the area can be generated by processing a number of backscattered electron frames of the area.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

Figure 1:
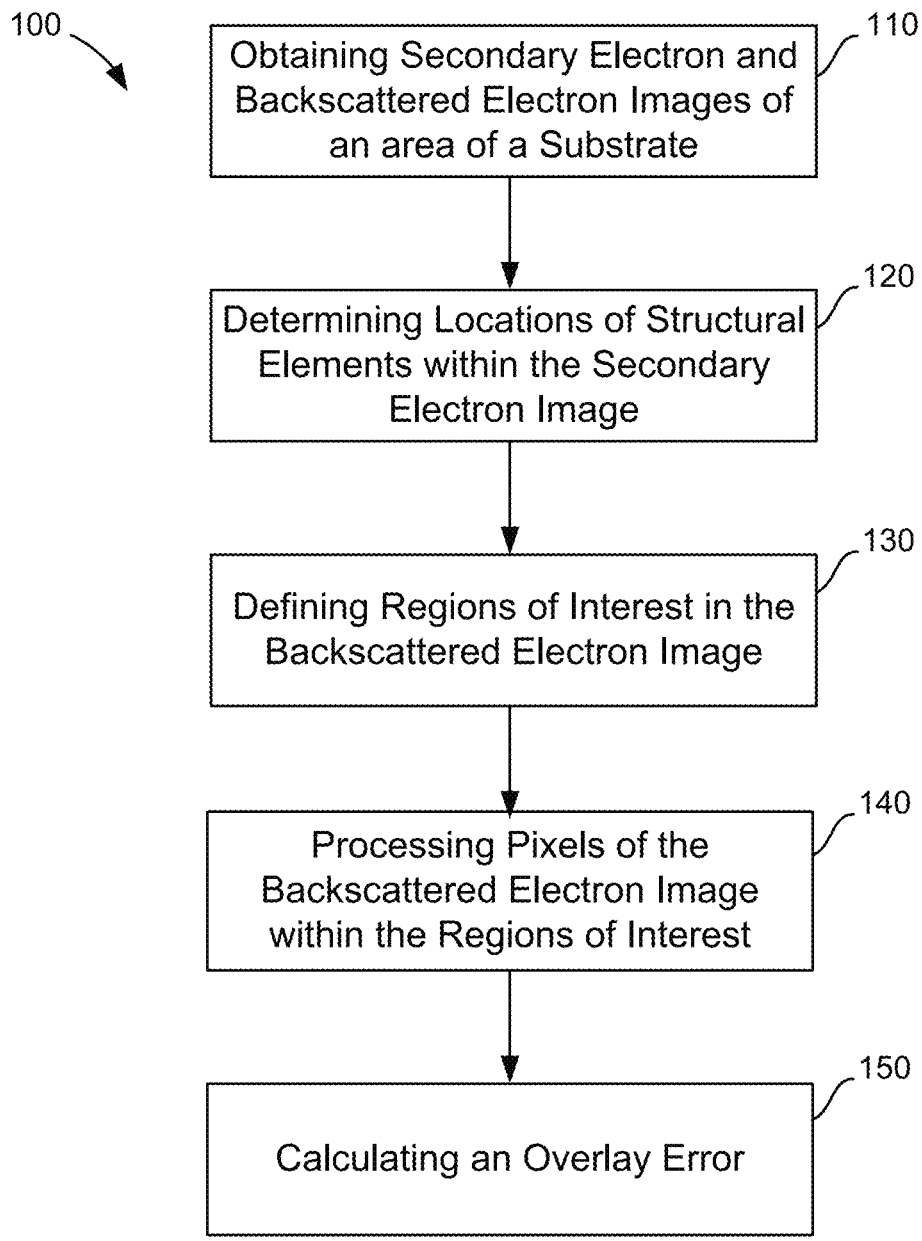
FIG. 1 illustrates an example of a method.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

A structural element means a nanometric scale structural element such as but not limited to a transistor, a part of a transistor, a memory cell, a part of a memory cell, an arrangement of conductors, and the like.

There may be provided a system, a method, and a non-transitory computer readable medium for overlay monitoring.

The overlay monitoring may be applied during a manufacturing process of a substrate, or following a completion of the manufacturing process of the substrate.

The substrate may be a wafer, a Micro-Electro-Mechanical Systems (MEMS) substrate, a solar panel, and the like.

In various examples it will be assumed, for simplicity of explanation, that the substrate is a wafer.

The overlay monitoring is applied on a wafer that includes one or more areas. Each area includes (a) a first array of repeatable first structural elements that are positioned at a surface of the substrate, and (b) a second array of repeatable second structural elements that are positioned below the first array and below the surface of the substrate. It should be noted that each die of the wafer may include one or more areas.

The first structural elements and the second structural elements are of nanometric dimensions—they have at least one dimension out of a width, a depth, and a length that is of nanometric scale. Each structural element of the first structural elements and/or of the second structural elements may be a perturbation, a recess, a line, a bump, a conductor, an insulator, a semiconductor, and the like.

The first structural elements are repeatable in the sense that they represent multiple instances of a same first structural element. In other words, the first structural elements are expected to be (under ideal circumstances) identical to each other.

The second structural elements are repeatable in the sense that they represent multiple instances of a same second structural element. In other words, the second structural elements are expected to be (under ideal circumstances) identical to each other.

Each first structural element is expected to be (under ideal circumstances) aligned with a corresponding second structural element. A deviation from such an alignment is an overlay error.

The number of first structural elements of the first array may be the same as the number of second structural elements of the second array. Alternatively, the number of first structural elements of the first array may differ from the number of second structural elements of the second array.

Information regarding the first structural elements can be obtained using secondary electrons emitted from the substrate, especially from the surface of the substrate and near the substrate.

Information regarding the second structural elements can be obtained using backscattered electrons emitted below the surface, especially few tens of nanometers below the surface.

In order to prevent damage to the substrate, the irradiation of the substrate by an electron beam is limited so that a backscattered electron image exhibits a lower than allowable signal to noise ratio.

The allowable signal to noise ratio may be defined in any manner, for example, by an operator of the overlay measurement, by a wafer manufacturer, by a client, and the like.

FIG. 1 illustrates method 100. Method 100 may start by step 110 of obtaining (for example—generating or receiving) (a) a secondary electron image of an area of a substrate, and (b) a backscattered electron image of the area of the substrate.

Step 110 may include illuminating the area one or more times with a charged particle beam and obtaining multiple secondary electron frames of the area, and multiple backscattered electron frames of the area.

A secondary electron frame of the area can be obtained concurrently with a backscattered electron frame of the area.

The multiple secondary electron frames may be averaged or otherwise processed to provide the secondary electron image of the area. The averaging or any other processing are aimed to increase the signal to noise ratio.

The multiple backscattered electron frames may be averaged or otherwise processed to provide the backscattered electron image of the area. The averaging or any other processing are aimed to increase the signal to noise ratio.

The number of secondary electron frames may be a few tens of frames or any other number of frames that will enable to generate a secondary electron image of the area that exhibits a signal to noise ratio that equals or exceeds the allowable signal to noise ratio threshold. It should be noted that the aggregate radiation dose, which may be a function of the aggregate duration of illumination and electron beam intensity of current, and/or one or more other factors (such as electron yield of the illuminated material, the topography of the illuminated elements) may determine the signal to noise ration. The number of backscattered electron frames does not allow to generate a backscattered electron image of the area that exhibits a signal to noise ratio that equals or exceeds an allowable signal to noise ratio threshold.

Step 110 may be followed by step 120 of determining locations of the first structural elements within the secondary electron image.

Step 120 may include determining the location of the first structural elements, determining the external boundaries of the first structural elements, determining the location of any part of the first structural elements, and the like. Step 120 may involve applying a blob analysis or any other analysis that may be deemed to determine a pattern in accurate and/or stable enough manner can be used—for example—pattern recognition based normalized cross correlation, Morphology, Shape detection etc.

Step 120 may be followed by step 130 of defining regions of interest in the backscattered electron image, based on the locations of the first structural elements.

In relation to the secondary electron image, a region of interest may be located at the location of a first structural element. The region of interest may cover the entire first structural element, may cover only a part of the first structural element, may cover more than the entirety of the first structural element, and the like.

A region of interest may be defined so that it is expected to cover (assuming an alignment or up to a certain overlay error) the entire second structural element, only a part of the second structural element, more than the entirety of the second structural element, and the like.

The region of interest should cover at least a minimal portion of the second structural element that will enable to determine an overlay error, if such exists.

The aggregate area of the regions of interest may amount to only a part of the entire area of the backscattered electron image of the area.

Step 130 may be followed by step 140 of processing pixels of the backscattered electron image that are located within the regions of interest to provide a backscattered electron representation of a second structural element.

Step 140 may benefit from the fact that the second structural elements of the array should be substantially the same. By generating a backscattered electron representation of a single second structural element based on the pixels located in multiple regions of interest, the signal to noise ratio of the backscattered electron representation of a single second structural element may be much higher than the signal to noise ratio of the backscattered image of the area.

For example, assuming that the backscattered image of the area captured a first plurality (N2) second structural elements, then the signal to noise ratio of the backscattered electron representation of a single second structural element can have a signal to noise ratio that is about N times better than the signal to noise ratio of the backscattered electron image of the area.

The backscattered electron representation of a single second structural element may be a synthetic backscattered electron image of the second structural element. The synthetic backscattered electron image may be calculated by averaging pixels located at same locations within different regions of interest.

Step 140 may be followed by step 150 of calculating an overlay error based on (i) location information regarding the second structural element within the backscattered electron representation of the second structural element, and (ii) location information regarding of at least one first structural element in the secondary electron image.

The overlay error may represent a misalignment between a point of the first structural element and a corresponding point of the second structural elements that should be aligned.

A point of the first structural element and a corresponding point of the second structural elements may exhibit a certain spatial relationship when there is no overlay error. Any deviation from the that certain spatial relationship can be regarded as an overlay error.

For example, step 150 may include calculating a displacement between a center of a first structural element and a center of the second structural element within the backscattered electron representation. The calculation may be applied to any other points of the first and second structural element.

Figure 2:
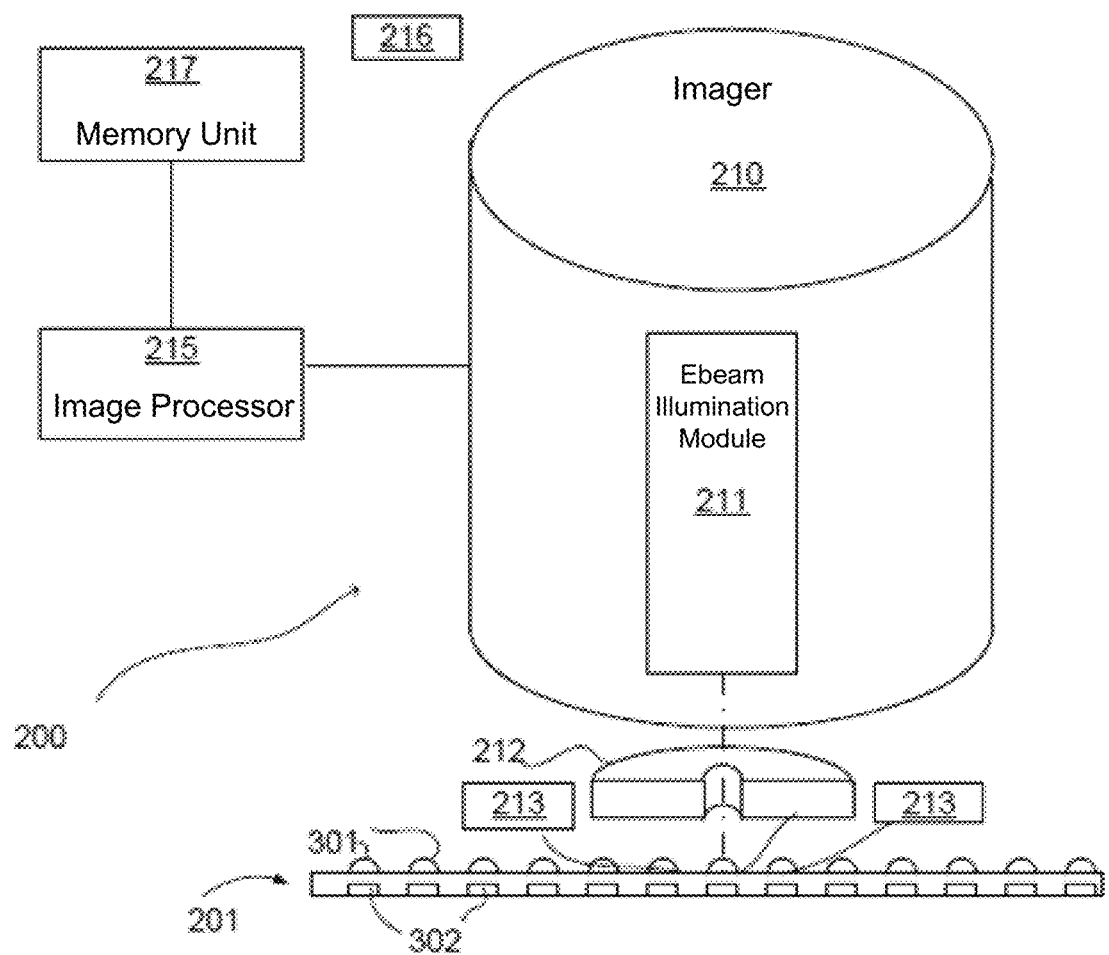
FIG. 2 illustrates an example of a substrate and a system.

FIG. 2 illustrates a wafer 201 and a system 200. System 200 that includes an imager 210, an image processor 215, a controller 216 for controlling system 200, and a memory unit 217.

The imager 210 is illustrated as including an electron beam illumination module 211, one or more secondary electron detectors such as secondary electron detectors 212, and one or more backscattered electron detectors such as backscattered electron detector 213.

The electron beam illumination module 211 may be configured to generate an electron beam and to illuminate an area of the wafer. The illumination may involve scanning the area with the electron beam.

In order to scan another area the imager may introduce a mechanical movement between the imager and the wafer and/or may manipulate the electron beam.

The secondary electron detector 212 may be configured to acquire multiple secondary electron frames of the area during multiple scans of the area by the electron beam.

The backscattered electron detector 213 may be configured to acquire multiple backscattered electron frames of the area during multiple scans of the area by the electron beam.

It should be noted that the secondary electron detector 212 and/or the backscattered electron detector 213 may output detection signals and that a frame grabber (not shown) may convert the detection signals to frames.

There may be any number of secondary electron detectors and/or any number of backscattered electron detectors.

Any secondary electron detector and/or any backscattered electron detector may have any shape and/or any size and/or any position within the imager, such as, out of lens, in-lens, and the like.

The image processor 215 may be configured to generate the secondary electron image of the area and the backscattered electron image of the area.

The image processor 215 may include one or more processing circuits such as microprocessors, graphic processing units, hardware accelerators, central processing units, neural network processors, image processors, and the like. The processor may be programmed (or otherwise constructed and arranged to, or configured to) execute any step of any of the method illustrated in the specification.

Various steps (for example, steps 120, 130, 140 and 150) of method 100 may be executed by the image processor.

Additionally or alternatively, various steps (for example, steps 120, 130, 140 and 150) of method 100 may be executed by another processor (not shown) that may belong to the system 200 or may not belong to the system.

Step 110 may be executed by system 200 or by a computerized system that does not belong to system 200.

Memory unit 217 may be a volatile or non-volatile memory unit, may be configured to store information (such as images), and/or instructions. The memory unit is an example of a non-transitory computer readable medium.

The imager 210 may be an electron beam imager, an electron beam microscope, an ion microscope, an ion imager, and the like. The electron beam microscope can be a scanning electron microscope, a transmission electron microscope, and the like.

FIG. 2 illustrates the wafer as including a first array of first structural elements 301, and second array of second structural elements 302. A first structural element should be aligned with a corresponding second structural element. Secondary electrons provide information about the first array and backscattered electrons provide information on the second array.

Figure 3:
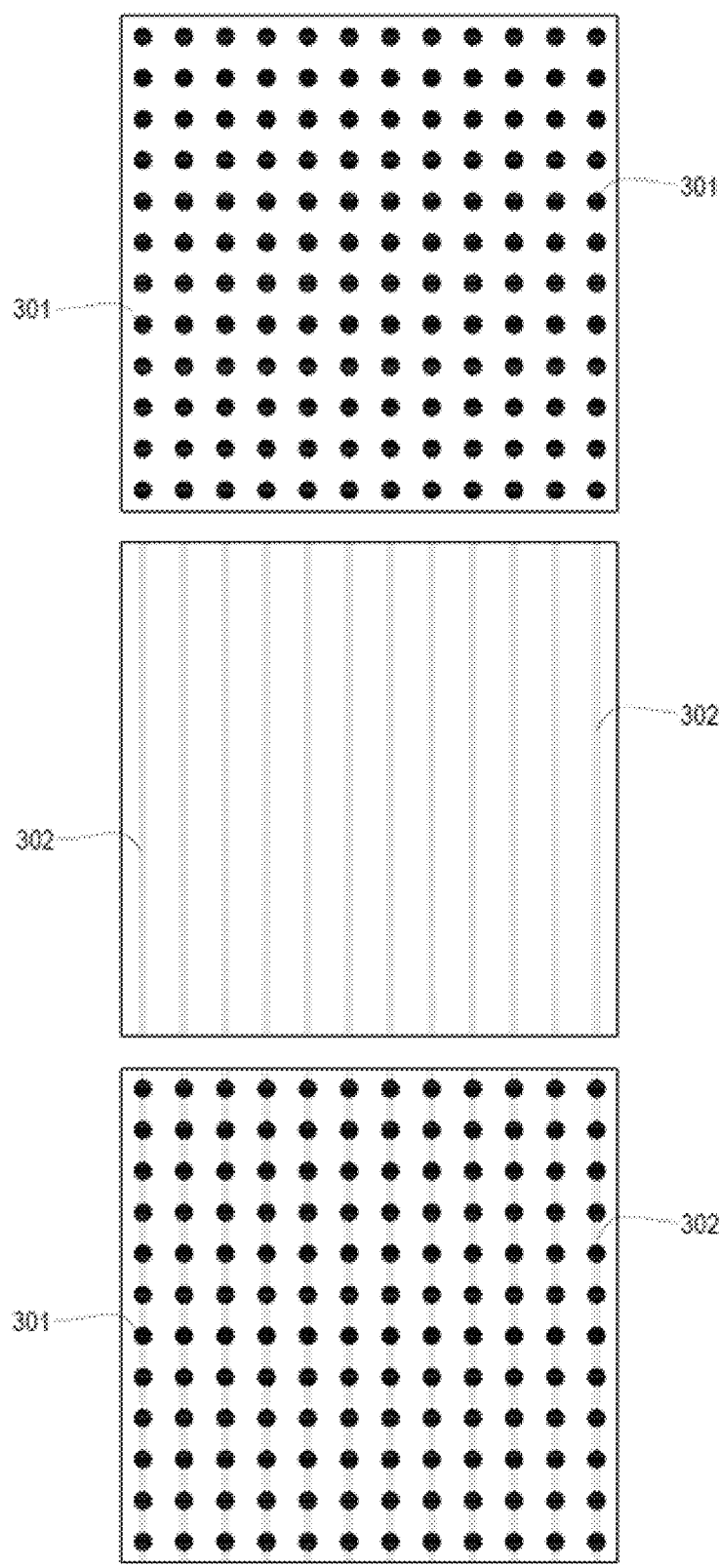
FIGS. 3-5 illustrates various images, regions of interest, and processing operations.

FIG. 3 illustrates a first array of first structural elements 301 such as bumps or recesses. FIG. 3 also illustrates a second array of second structural elements 302 such as lines. FIG. 3 also illustrates the first array being on top of the second array. Each bump or recess should be located directly above a line.

Figure 4:
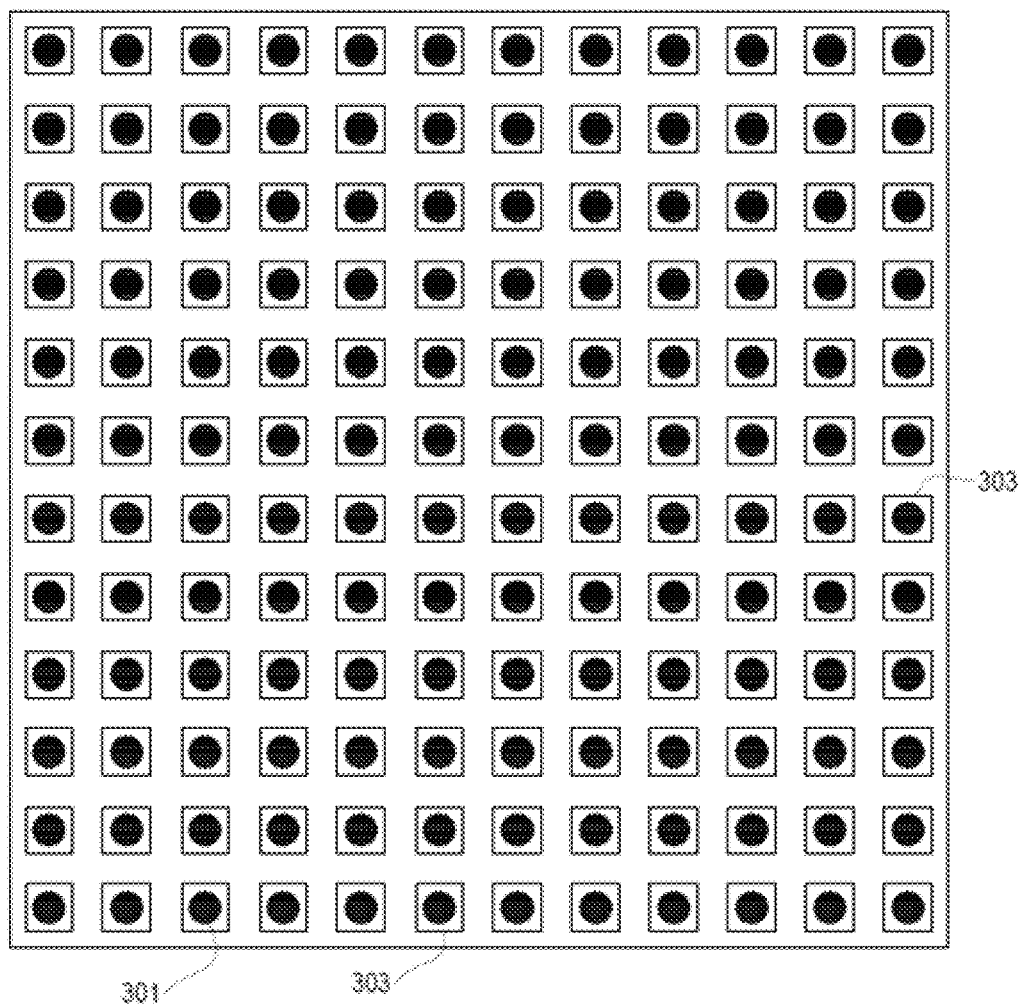

FIG. 4 illustrates multiple regions of interest 303 that are defined to surround first structural elements 301. FIG. 4 illustrates an ideal noise free secondary electron image, whereas a real secondary image is much noisier.

Figure 5:
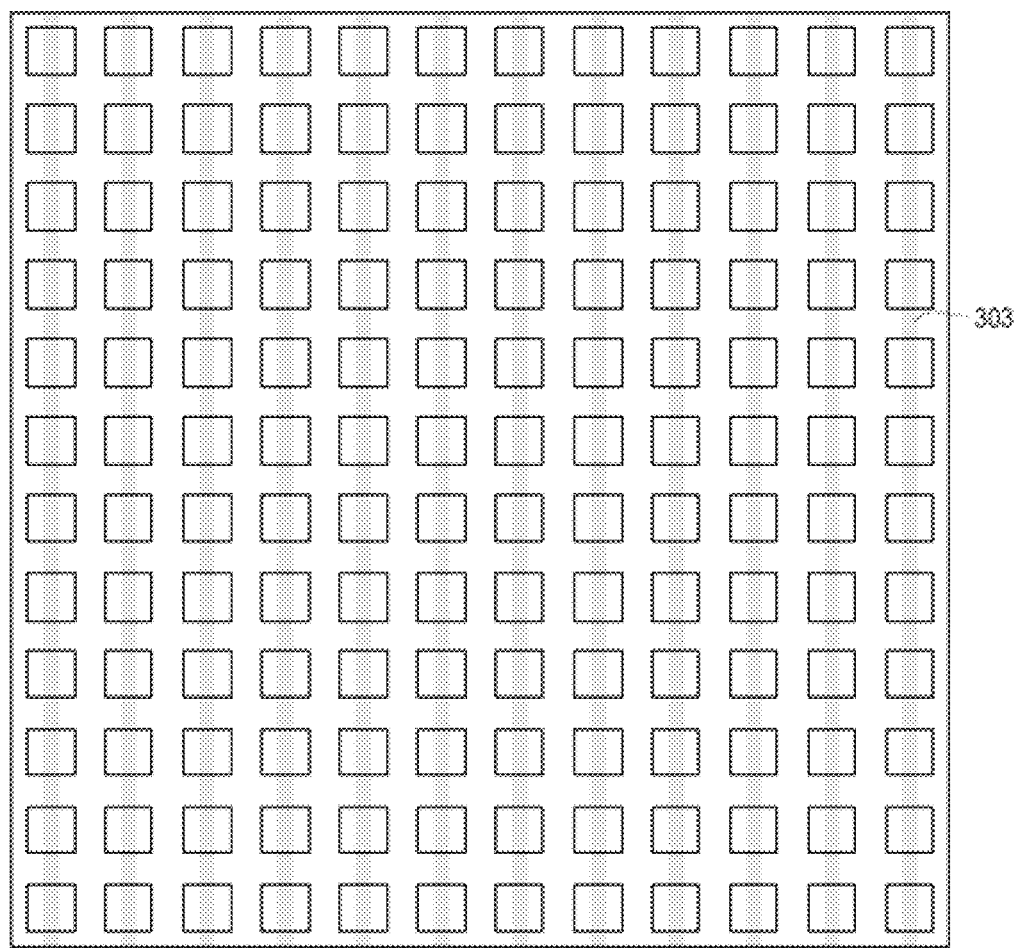
Figure 5:
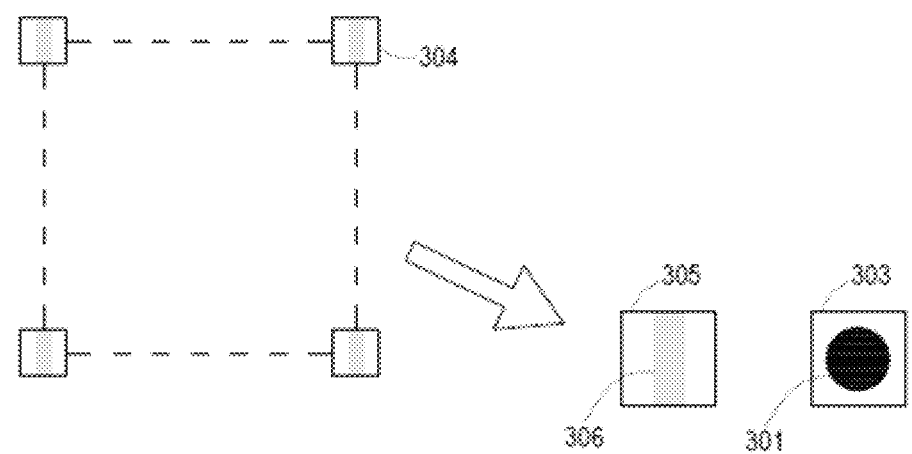

FIG. 5 illustrates that the multiple regions of interest 303 of FIG. 4 are applied on an ideal backscattered image of the second array. FIG. 5 illustrates an ideal noise free backscattered electron image, whereas a real backscattered image is much noisier.

FIG. 5 also illustrates a processing of the pixels of parts 304 of the backscattered electron image that bounded by the regions of interest 303 defined in the secondary electron image.

The pixels of parts 304 are processed (for example by averaging) to provide a backscattered electron representation 305 of the second structural element.

The backscattered electron representation 306 of the second structural element is compared to an image of a first structural element 301 to determine an overlay error.

Although the text above discussed how to obtain a better backscattered image in the context of overlay, it should be noted that the method, system and the computer-readable medium may be applied, mutatis mutandis, on generating a backscattered image, in other applications/processes or solutions. For example, a backscattered electron representation of a buried or partially buried structural element may be obtained for metrology, measuring critical dimension, and the like.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

Any combination of any module or unit listed in any of the figures, any part of the specification and/or any claims may be provided. Especially any combination of any claimed feature may be provided.

Any reference to the term "comprising" or "having" should be interpreted also as referring to "consisting" of "essentially consisting of". For example, a method that comprises certain steps can include additional steps, can be limited to the certain steps or may include additional steps that do not materially affect the basic and novel characteristics of the method, respectively.

The embodiment may also be implemented in a computer program for running on a computer system, at least including code portions for performing steps of a method according to the embodiment when run on a programmable apparatus, such as a computer system or enabling a programmable apparatus to perform functions of a device or system according to the embodiment. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a computer program product such as non-transitory computer readable medium. All or some of the computer program may be provided on non-transitory computer readable media permanently, removably or remotely coupled to an information processing system. The non-transitory computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices.

The foregoing specification, includes specific examples of one or more embodiments. It will, however, be evident that various modifications and changes may be made therein without departing from the broader spirit and scope of the one or more embodiments as set forth in the appended claims.

What is claimed is:

1. A method for overlay monitoring, the method comprising:
    obtaining a secondary electron image of an area of a substrate and a backscattered electron image of the area of the substrate, the area of the substrate comprising a first array of first structural elements that are repeatable and are positioned at a surface of the substrate and a second array of second structural elements that are repeatable and are positioned below the first array and below the surface of the substrate;
    determining a plurality of different locations of the first structural elements within the secondary electron image;
    defining a plurality of different regions of interest in the backscattered electron image, based on the plurality of different locations of the first structural elements, wherein each region of interest within the plurality of different regions of interest is represented by a subset of pixels in the backscattered electron image that depicts at least a portion of a second structural element in the region;
    processing a plurality of different subsets of pixels of the backscattered electron image representing the plurality of regions of interest to generate a backscattered electron representation of a single second structural element from the plurality of different subsets of pixels; and
    calculating an overlay error based on location information regarding the second structural element within the backscattered electron representation of the second structural element and on location information regarding of at least one first structural element in the secondary electron image.

2. The method according to claim 1 wherein the processing the plurality of different subsets of pixels comprises averaging pixels located at same locations within each of the different regions of interest to provide a synthetic backscattered electron image of the second structural element.

3. The method according to claim 1 wherein the determining of the locations of the first structural elements comprises applying a blob analysis.

4. The method according to claim 1 wherein the calculation of the overlay error comprises calculating a displacement between a center of the at least one first structural element and a center of the second structural element within the backscattered electron representation.

5. The method according to claim 1 wherein a signal to noise ratio of the backscattered electron image is below an allowable signal to noise ratio threshold, and wherein a signal to noise ratio of the backscattered electron representation is not smaller than the allowable signal to noise ratio threshold.

6. The method according to claim 1 wherein the secondary electron image of the area and the backscattered electron image of the area are acquired concurrently.

7. The method according to claim 1 further comprising generating the secondary electron image and the backscattered electron image without damaging the area.

8. The method according to claim 1 further comprising generating the secondary electron image of the area by processing a number of secondary electron frames of the area; and generating the backscattered electron image of the area by processing a number of backscattered electron frames of the area.

9. A non-transitory computer readable medium that stores instructions for:
    obtaining a secondary electron image of an area of a substrate and a backscattered electron image of the area of the substrate, the area of the substrate comprises a first array of first structural elements that are repeatable and are positioned at a surface of the substrate, and a second array of second structural elements that are repeatable and are positioned below the first array and below the surface of the substrate;
    determining a plurality of different locations of the first structural elements within the secondary electron image;
    defining a plurality of different regions of interest in the backscattered electron image, based on the plurality of different locations of the first structural elements, wherein each region of interest within the plurality of different regions of interest is represented by a subset of pixels in the backscattered electron image that depicts at least a portion of a second structural element in the region;
    processing a plurality of different subsets of pixels of the backscattered electron image representing the plurality of regions of interest to generate a backscattered electron representation of a single second structural element from the plurality of different subsets of pixels; and
    calculating an overlay error based on location information regarding the second structural element within the backscattered electron representation of the second structural element and on location information regarding of at least one first structural element in the secondary electron image.

10. A system for overlay monitoring, the system comprises a processor;
    wherein the system is configured to obtain a secondary electron image of an area of a substrate and a backscattered electron image of the area of the substrate, the area of the substrate comprises a first array of first structural elements that are repeatable and are positioned at a surface of the substrate, and a second array of second structural elements that are repeatable and are positioned below the first array and below the surface of the substrate; and
    wherein the processor is configured to:
        determine a plurality of different locations of the first structural elements within the secondary electron image;

define a plurality of different regions of interest in the backscattered electron image, based on the plurality of different locations of the first structural elements, wherein each region of interest within the plurality of different regions of interest is represented by a subset of pixels in the backscattered electron image that depicts at least a portion of a second structural element in the region;

process a plurality of different subsets of pixels of the backscattered electron image representing the plurality of regions of interest to generate a backscattered electron representation of a single second structural element from the plurality of different subsets of pixels; and calculate an overlay error based on location information regarding the second structural element within the backscattered electron representation of the second structural element and on location information regarding of at least one first structural element in the secondary electron image.

11. The system according to claim 10 wherein the processor is configured to process the pixels by averaging pixels located at same locations within different regions of interest to provide a synthetic backscattered electron image of the second structural element.

12. The system according to claim 10 wherein the processor is configured to determine the locations of the first structural elements by applying a blob analysis.

13. The system according to claim 10 wherein the processor is configured to calculate the overlay error by calculating a displacement between a center of the at least one first structural element and a center of the second structural element within the backscattered electron representation.

14. The system according to claim 10 wherein a signal to noise ratio of the backscattered electron image is below an allowable signal to noise ratio threshold, and wherein a signal to noise ratio of the backscattered electron representation is not smaller than the allowable signal to noise ratio threshold.

15. The system according to claim 10 wherein the secondary electron image of the area and the backscattered electron image of the area are acquired concurrently.

* * * * *